United States Patent
Tokumaru et al.

(10) Patent No.: US 10,978,988 B2
(45) Date of Patent: Apr. 13, 2021

(54) SELECTIVE EMITTER FOR THERMOPHOTOVOLTAIC POWER GENERATOR

(71) Applicant: NIPPON STEEL & SUMITOMO METAL CORPORATION, Tokyo (JP)

(72) Inventors: Shinji Tokumaru, Tokyo (JP); Tomohiro Uno, Tokyo (JP)

(73) Assignee: NIPPON STEEL CORPORATION, Tokyo (JP)

( * ) Notice: Subject to any disclaimer, the term of this patent is extended or adjusted under 35 U.S.C. 154(b) by 145 days.

(21) Appl. No.: 16/089,249

(22) PCT Filed: Mar. 29, 2017

(86) PCT No.: PCT/JP2017/013057
§ 371 (c)(1),
(2) Date: Sep. 27, 2018

(87) PCT Pub. No.: WO2017/170768
PCT Pub. Date: Oct. 5, 2017

(65) Prior Publication Data
US 2020/0127596 A1 Apr. 23, 2020

(30) Foreign Application Priority Data
Mar. 31, 2016 (JP) .............................. JP2016-071272

(51) Int. Cl.
*H02S 10/30* (2014.01)
*H01L 31/055* (2014.01)
(Continued)

(52) U.S. Cl.
CPC .............. *H02S 10/30* (2014.12); *C01B 33/12* (2013.01); *C01G 23/047* (2013.01); *C01G 35/00* (2013.01); *C01G 37/033* (2013.01); *H01L 31/055* (2013.01)

(58) Field of Classification Search
None
See application file for complete search history.

(56) References Cited

U.S. PATENT DOCUMENTS

| 5,626,687 A | 5/1997 | Campbell |
| 6,271,461 B1 | 8/2001 | Fraas et al. |

(Continued)

FOREIGN PATENT DOCUMENTS

| CN | 105152688 A | 12/2015 |
| JP | 8-274362 A | 10/1996 |

(Continued)

OTHER PUBLICATIONS

Extended European Search Report for European Application No. 17775302.7, dated Nov. 4, 2019.
(Continued)

*Primary Examiner* — Tamir Ayad
(74) *Attorney, Agent, or Firm* — Birch, Stewart, Kolasch & Birch, LLP

(57) ABSTRACT

A selective emitter exhibiting heat resistance up to 1000° C., comprising a metal body, a first dielectric layer provided on one surface of the metal body, a composite layer provided on another surface of the first dielectric layer at an opposite side to the metal body side, and a second dielectric layer provided on another surface of the composite layer at an opposite side to the first dielectric layer, the composite layer being a layer provided with a metal or semiconductor dispersed in an oxide of the metal or the semiconductor.

10 Claims, 8 Drawing Sheets

(51) Int. Cl.
*C01B 33/12* (2006.01)
*C01G 23/047* (2006.01)
*C01G 35/00* (2006.01)
*C01G 37/033* (2006.01)

(56) References Cited

U.S. PATENT DOCUMENTS

| | | | |
|---|---|---|---|
| 7,166,797 | B1 | 1/2007 | Dziendziel et al. |
| 2003/0034065 | A1* | 2/2003 | Meulenberg, Jr. ............... H01L 33/0004 136/253 |
| 2003/0092226 | A1 | 5/2003 | Nagashima et al. |
| 2003/0132441 | A1* | 7/2003 | Takatani ............ H01S 5/34333 257/79 |
| 2008/0238289 | A1* | 10/2008 | Zalyubovskiy .......... H01K 3/02 313/483 |
| 2009/0165849 | A1* | 7/2009 | Chan ................ H01L 31/03925 136/256 |
| 2013/0213460 | A1 | 8/2013 | Matsumoto |
| 2014/0007921 | A1 | 1/2014 | Kuramachi |
| 2015/0285532 | A1 | 10/2015 | Tsutsui et al. |
| 2015/0300695 | A1 | 10/2015 | Takeuchi et al. |

FOREIGN PATENT DOCUMENTS

| | | |
|---|---|---|
| JP | 2000-272955 A | 10/2000 |
| JP | 2003-152207 A | 5/2003 |
| JP | 2004-103649 A | 4/2004 |
| JP | 2006-298671 A | 11/2006 |
| JP | 2011-96770 A | 5/2011 |
| JP | 2011-222211 A | 11/2011 |
| JP | 2012-204605 A | 10/2012 |
| JP | 2014-67968 A | 4/2014 |
| JP | 2014-85099 A | 5/2014 |
| JP | 2014-85101 A | 5/2014 |
| JP | 2015-41620 A | 3/2015 |
| WO | WO 2012/056806 A1 | 5/2012 |

OTHER PUBLICATIONS

International Preliminary Report on Patentability and Written Opinion of the International Searching Authority (Forms PCT/IB/326, PCT/IB/373 and PCT/ISA/237), dated Oct. 11, 2018, in International Application No. PCT/JP2017/013057, with English translation.

International Search Report (Form PCT/ISA/210), dated Jul. 4, 2017, in International Application No. PCT/JP2017/013057, with English translation.

\* cited by examiner

SELECTIVE EMITTER FOR THERMOPHOTOVOLTAIC POWER GENERATOR

FIELD

The present invention relates to a selective emitter which converts energy emitted from a heat source (emitted light) to light having a predetermined wavelength distribution.

BACKGROUND

As a method of utilizing waste heat of a temperature range of 500° C. or more, thermophotovoltaic (TPV) power generation is gathering attention. In thermophotovoltaic power generation, heat energy (emitted light) is converted to light having a predetermined wavelength distribution by selection of wavelength by a selective emitter, the converted light is emitted from the selective emitter, and the light emitted from the t selective emitter is converted to electricity by a photovoltaic (PV) device. Thermophotovoltaic power generation can directly transform heat energy to electrical energy, so is excellent in energy conversion efficiency.

Wavelength matching between the emission characteristic of a selective emitter which selects the wavelength of emitted light generated from a heat source and the absorption characteristic of a photovoltaic device which converts the emitted light from the selective emitter to electricity becomes important. For this reason, development of a selective emitter able to selectively emit a wavelength which a photovoltaic device can convert to electricity has been desired.

PTL 1 discloses a selective emitter including a composite material of at least one type of semiconductor and at least one type of metal material. PTL 1 illustrates $FeSi_X$ (X=0.5 to 4) as a semiconductor and illustrates Ag, Mo, and Cu as metal materials.

PTL 2 discloses a selective emitter including a composite material of at least one type of semiconductor and a dielectric. PTL 2 illustrates $FeS_2$, $Mg_2Si$, $Zn_3As_2$, and Ge as a semiconductor and illustrates $SiO_2$, $Al_2O_3$, and AlN as a dielectric.

PTL 3 discloses a heat conversion device comprised of a base material on the upper surface and lower surface of which an infrared emitting material layer and an antireflection layer are laminated. As one example of such a heat conversion device, an example with an infrared emitting material layer of a cermet film of Cr and $Cr_2O_3$ and an antireflection film of $Cr_2O_3$ is disclosed.

PTL 4 discloses an emitter for thermophotovoltaic power generation comprised of an Fe, Co, Ni, stainless steel, or other substrate on which P—$FeSi_2$ or another antireflection film is provided.

CITATION LIST

Patent Literature

PTL 1: Japanese Patent Publication No. 2014-85099A
PTL 2: Japanese Patent Publication No. 2014-85101A
PTL 3: WO2012/056806A
PTL 4: Japanese Patent Publication No. 2011-096770A

SUMMARY

Technical Problem

The selective emitter disclosed in PTLs 1 to 4 have the problem that the materials forming the composite material react at a high temperature of up to 1000° C. resulting in deterioration of the wavelength selectivity, so sufficient heat resistance cannot be obtained.

The present invention, in consideration of this situation, has as its object the provision of a selective emitter able to exhibit heat resistance up to 1000° C.

Solution to Problem

The inventors engaged in intensive studies on the configuration of a selective emitter to raise the heat resistance and came up with the present invention. The gist is as follows:

(1) A selective emitter comprising a metal body, a lower layer made of a dielectric provided on one surface of the metal body, a composite layer provided on another surface of the lower layer at an opposite side to the metal body side, and an upper layer made of a dielectric provided on another surface of the composite layer at an opposite side to the lower layer, the composite layer being a layer provided with a metal or semiconductor dispersed in an oxide of the metal or the semiconductor.

(2) The selective emitter according to (1) wherein the metal or semiconductor dispersed in the composite layer is one selected from Cr, Si, Ta, and Ti, and the lower layer and the upper layer are an oxide of the metal or the semiconductor.

(3) The selective emitter according to (1) wherein the metal or semiconductor dispersed in the composite layer is one selected from Cr, Si, Ta, and Ti, the lower layer is an oxide of the metal or the semiconductor or $SiO_2$, and the upper layer is $SiO_2$.

(4) The selective emitter according to any one of (1) to (3) wherein a physical thickness of the composite layer is 5 nm to 200 nm and physical thicknesses of the lower layer and the upper layer are 10 nm to 300 nm.

(5) A selective emitter comprising a metal body, a composite layer provided on one surface of the metal body, and an upper layer made of a dielectric provided on another surface of the composite layer at an opposite side to the metal body, the composite layer being a layer provided with a metal or semiconductor dispersed in an oxide of the metal or the semiconductor.

(6) The selective emitter according to (5) wherein the metal or semiconductor dispersed in the composite layer is one selected from Cr, Si, Ta, and Ti, and the upper layer is an oxide of the metal or the semiconductor.

(7) The selective emitter according to (5) wherein the metal or semiconductor dispersed in the composite layer is one selected from Cr, Si, Ta, and Ti, and the upper layer is $SiO_2$.

(8) The selective emitter according to any one of (5) to (7) wherein a physical thickness of the composite layer is 5 nm to 200 nm, while a physical thickness of the upper layer is 10 nm to 300 nm.

(9) A selective emitter comprising a metal body, a lower layer made of a dielectric provided on one surface of the metal body, and a composite layer provided on another surface of the lower layer at an opposite side to the metal body side, the composite layer being a layer provided with a metal or semiconductor dispersed in an oxide of the metal or the semiconductor.

(10) The selective emitter according to (9) wherein the metal or semiconductor dispersed in the composite layer is one selected from Cr, Si, Ta and Ti, and the lower layer is an oxide of the metal or the semiconductor.

(11) The selective emitter according to (9) wherein the metal or semiconductor dispersed in the composite layer is one selected from Cr, Si, Ta, and Ti, and the lower layer is $SiO_2$.

(12) The selective emitter according to any one of (9) to (11) wherein a physical thickness of the composite layer is 5 nm to 200 nm, while a physical thickness of the lower layer is 10 nm to 300 nm.

(13) The selective emitter according to any one of (1) to (12) wherein the metal body is a Ti—W—Si layer or a W—Si/Ti—W—Si layer.

(14) The selective emitter according to any one of (1) to (13) further comprising a substrate provided on another surface of the metal body at an opposite side to the one surface and a gray body provided on a surface of the substrate at an opposite side to the metal body side.

(15) The selective emitter according to (14) wherein the substrate is Si or quartz.

(16) The selective emitter according to (14) wherein the substrate is comprised of Si and an $SiO_2$ film is provided between the substrate and the metal body.

(17) The selective emitter according to (14) wherein the substrate is a metal substrate.

(18) The selective emitter according to (17) wherein the metal substrate is formed by an Fe alloy or Ni alloy.

(19) The selective emitter according to any one of (14) to (18) wherein the gray body comprises at least one of SiC, Fe oxide, Cr oxide, Ni oxide, or a mixture of an Fe oxide, Cr oxide, and Ni oxide.

Advantageous Effects of Invention

According to the present invention, it is possible to obtain a selective emitter having a heat resistance up to 1000° C.

DESCRIPTION OF EMBODIMENTS

Figure 1:
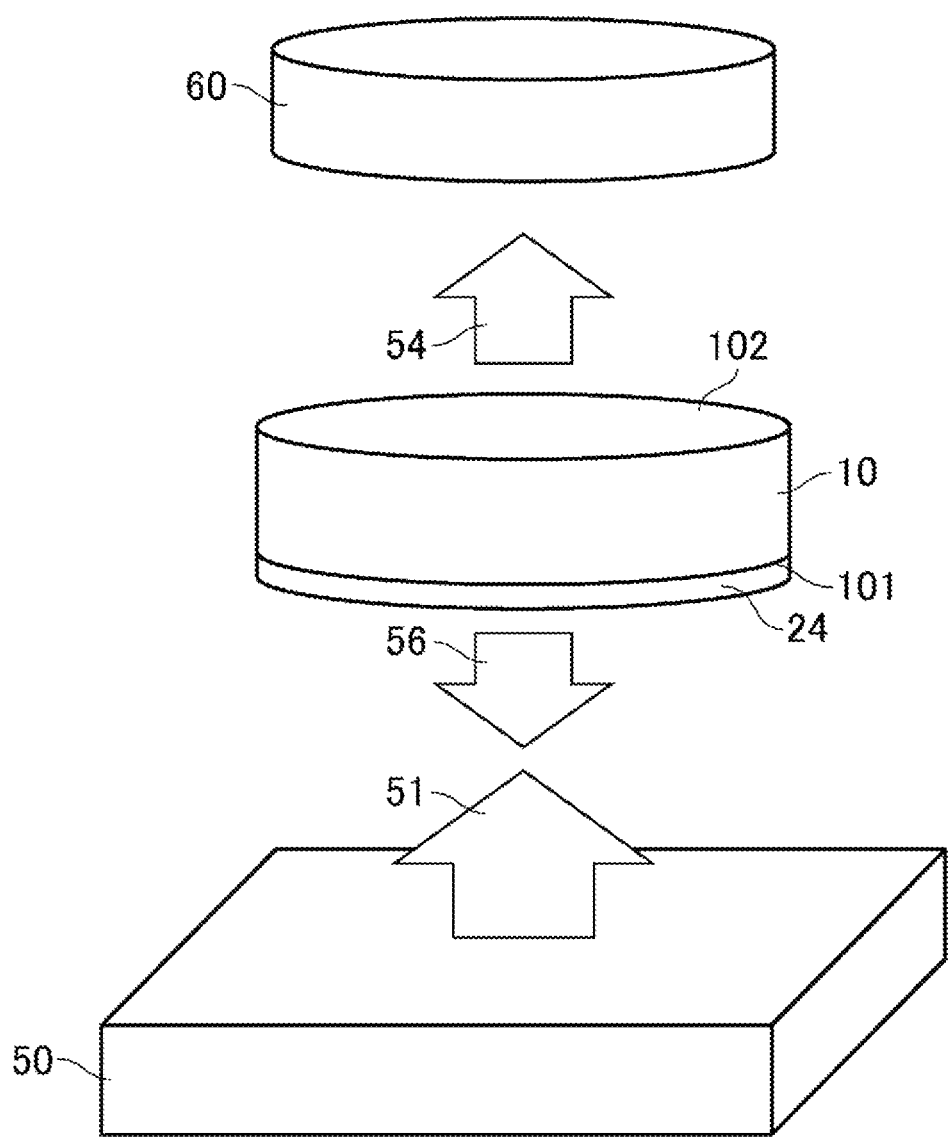
FIG. 1 is a view schematically showing the configuration of a thermophotovoltaic power generation system.

Below, referring to the drawings, embodiments of the present invention will be explained in detail.

Overall Configuration

First, referring to FIG. 1 and FIG. 2, thermophotovoltaic power generation will be explained. In thermophotovoltaic power generation, emitted light 51 from a heat source 50 is converted to light 54 having a predetermined wavelength distribution by wavelength selection by a selective emitter 10, the selective light 54 is emitted from the selective emitter 10, and the light 54 emitted from the selective emitter is converted to electricity by a photovoltaic device 60.

The wavelength range of heat emitted from a 1000° C. or so heat source 50 is 0.5 µm to 20 µm, but the absorption wavelength region 62 of the photovoltaic device 60 is 0.8 µm to 1.8 µm if the photovoltaic device 60 is GaSb, while is 1.5 µm to 2.5 µm if the photovoltaic device 60 is InGaAs.

If trying to directly generate power by the photovoltaic device 60 from light emitted from the heat source 50, if the photovoltaic device 60 is GaSb, light of over 1.8 µm, while if the photovoltaic device 60 is InGaAs, light of over 2.5 µm cannot be used for power generation of the photovoltaic device 60 and is used only for heating the photovoltaic device 60. Further, the photovoltaic device 60 rising in temperature falls in output, so the power for cooling the photovoltaic device 60 also ends up becoming larger.

Figure 2:
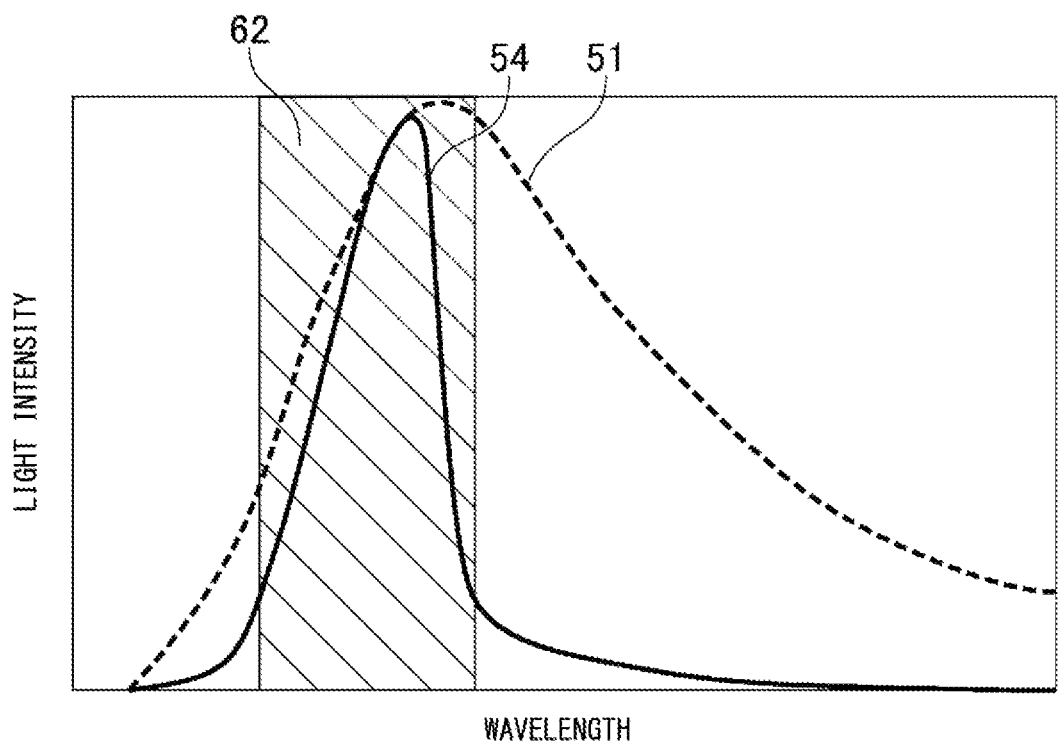
FIG. 2 is a view schematically showing the relationship between energy emitted from a heat source in a thermophotovoltaic power generation system (emitted light), light emitted from a selective emitter, and an absorption wavelength band of a photovoltaic device.

Therefore, as shown in FIG. 1, by arranging between the heat source 50 and photovoltaic device 60, a selective emitter 10 selectively emitting light 54 in a wavelength range matching the absorption wavelength region 62 of the photovoltaic device 60 (selectively emitting light of a wavelength region of about 0.8 µm to 1.8 µm when the photovoltaic device 60 is GaSb and selectively emitting light of a wavelength region of about 1.5 µm to 2.5 µm when the photovoltaic device 60 is InGaAs), it is possible to prevent a drop in output of the photovoltaic device 60 and suppress the cooling power of the photovoltaic device 60.

By forming a layer with a high emissivity (gray body) 24 at the surface 101 of the selective emitter 10 at the heat source 50 side, light of the entire wavelength in the light emitted from the heat source 50 is absorbed and the selective emitter 10 itself is heated, while at the surface 102 of the selective emitter 10 at the photovoltaic device 60 side, if the photovoltaic device 60 is GaSb, light of a wavelength region of about 0.8 µm to 1.8 µm is selectively emitted and if the photovoltaic device 60 is InGaAs, light of a wavelength region of about 1.5 µm to 2.5 µm is selectively emitted, so the selective emitter 10 rises in temperature to one close to the temperature of the heat source 50, but is hard to cool, so the energy loss at the selective emitter 10 is small. Further, by forming a layer with a high emissivity (gray body) 24 at the surface 101 of the selective emitter 10 at the heat source 50 side, the excess heat 56 returns to the heat source 50, so the heat of the heat source 50 is also held.

Next, the selective emitter 10 will be explained.

First Embodiment

Figure 3:
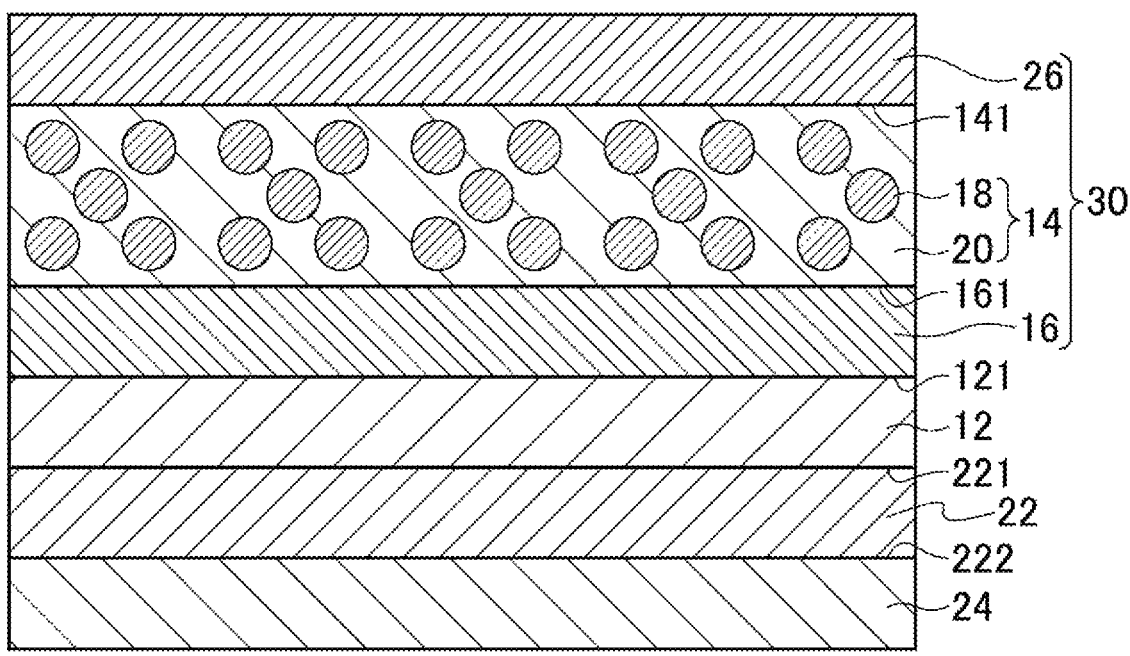
FIG. 3 is a longitudinal cross-sectional view schematically showing the configuration of the selective emitter according to a first embodiment.

As shown in FIG. 3, the selective emitter 10 of the present embodiment is provided with a substrate 22, a gray body 24 provided at the surface 222 of the substrate 22, a metal body 12 provided at the surface 221 of the substrate 22 at the opposite side to the surface 222, and a membrane laminate 30 on which a lower layer 16 made of a dielectric provided on one surface 121 of the metal body 12, a composite layer 14, and an upper layer 26 made of a dielectric are stacked.

The composite layer 14 contains an added material 18 and a base material 20. The added material 18 is provided dispersed in the base material 20. The lower layer 16 is provided on one surface 121 of the metal body 12. The composite layer 14 is provided on one surface 161 of the lower layer 16. The upper layer 26 is provided in contact with the surface 141 of the composite layer 14.

The selective emitter 10 selects the wavelength of the heat energy emitted by the emitted light and selectively emits light of a wavelength which the photovoltaic device 60 can convert to electricity. The selective emitter 10 according to the present embodiment, when the photovoltaic device 60 is GaSb, has a high emissivity in the range of a wavelength of 0.8 to less than 1.8 μm and suppresses emissivity at a wavelength of 1.8 μm or more, while when the photovoltaic device 60 is InGaAs, has a high emissivity in the range of a wavelength of 1.5 to less 2.5 μm and suppresses emissivity at a wavelength of 2.5 μm or more. The "emissivity" means the ratio of the intensity of emission of the emitter and the intensity of emission of a black body of the same temperature as the emitter.

In the selective emitter 10 of the present embodiment, due to the lower layer 16 and upper layer 26 being provided between the metal body 12 and composite layer 14, the layers used for wavelength selection become the lower layer 16, composite layer 14, and upper layer 26. There are many combinations of thicknesses of these layers. Further, even if the thicknesses of these layers fluctuate somewhat, the effect on the wavelength selectivity is small, so production of the selective emitter 10 is easy.

The metal body 12 preferably has a high reflectance at a wavelength of 0.5 μm or more and heat resistance. The metal body 12 preferably does not react with the preferable materials of the base material 20 of the composite layer 14 explained later, that is, $Ta_2O_5$, $TiO_2$, $Cr_2O_3$, and $SiO_2$, even at a high temperature of up to 1000° C. The metal body 12 can be formed from one type of metal selected from W, Mo, Fe, Ni, and Cr as a main ingredient. The "main ingredient" is an ingredient with a concentration of over 50 wt %. The metal body 12 may be formed by an alloy. For example, it can be formed by an Fe alloy, Ni alloy, etc. If the metal body 12 is formed by titanium-tungsten-silicide (Ti—W—Si) or titanium-tungsten-silicide and tungsten silicide (W—Si) stacked together, it is possible to suppress diffusion and reaction between the metal body 12 and the lower layer 16 and possible to secure heat resistance at 1200° C. or more, so this is particularly preferable from the viewpoint of the heat resistance. The thickness of the metal body 12 in the present embodiment is preferably 100 nm or more.

The added material 18 of the composite layer 14 is formed by a metal or semiconductor. The metal or semiconductor is preferably one type selected from Ta, Ti, Cr, and Si. The added material 18 is preferably made of particles with a particle size of 1 nm to 10 nm or so. The composite layer 14 preferably contains the added material 18 in an amount of 30 vol % to 80 vol %. In the composite layer 14, if the added material 18 is less than 30 vol %, a sufficient refractive index cannot be secured, so wavelength selection becomes difficult, while if over 80 vol %, the added material 18 bonds with itself easily forming a continuous film. By forming a metal layer or semiconductor layer in the composite layer 14, the possibility arises of wavelength selectivity being lost.

The base material 20 of the composite layer 14 is an oxide of the metal or semiconductor forming the added material 18. That is, if the added material 18 is Ta, the base material 20 is formed by $Ta_2O_5$, if the added material 18 is Ti, the base material 20 is formed by $TiO_2$, if the added material 18 is Cr, the base material 20 is formed by $Cr_2O_3$, and if the added material 18 is Si, the base material 20 is formed by $SiO_2$. By combining the added material 18 and the base material 20, under a high temperature of up to 1000° C., the base material 20 will not react with the added material 18 and the added material 18 will not oxidize in the base material 20 but will stably remain.

The physical thickness of the composite layer 14 is preferably 5 nm to 200 nm.

The lower layer 16 and upper layer 26 is formed by a dielectric material not reacting with the base material 20 of the composite layer 14 even at a high temperature up to 1000° C. The lower layer 16 and the upper layer 26 are preferably comprised of an oxide of the added material 18 or $SiO_2$. Here, the oxide of the added material 18 is the oxide forming the base material 20 of the composite layer 14. That is, the lower layer 16 and the upper layer 26, when using other than $SiO_2$, are preferably the same as the oxide forming the base material 20.

$SiO_2$ can be applied to all added materials 18 as the lower layer 16 and upper layer 26 regardless of the metal or semiconductor. $SiO_2$ is a material which has a melting point of 1500° C. or more and has a high heat resistance not possessed by a compound of an oxide composition which easily evaporates even in a high temperature oxidizing atmosphere and is chemically stable, so will not react with the composite layer 14 or metal body 12 to form a compound and will not ruin the wavelength selectivity of the selective emitter. In particular, it is effective to use $SiO_2$ as the upper layer 26 in contact with the outside air.

The lower layer 16 and upper layer 26 preferably have physical thicknesses of 10 nm to 300 nm.

The composite layer 14 has the added material 18 dispersed in it, so the composite layer 14 and the lower layer 16 and upper layer 26 differ in refractive index from each other. As a result, the membrane laminate 30 of the composite layer 14, lower layer 16, and upper layer 26 has wavelength selectivity.

The substrate 22 of the selective emitter 10 preferably is formed by Si, metal, or quartz. As the metal, for example, an Fe alloy, Ni alloy, etc. can be used. As the Fe alloy, SUS304 may be preferably illustrated, while as the Ni alloy, Inconel® may be preferably illustrated. If forming the substrate 22 by a metal, the metal body 12 may be made integral with the substrate 22 and the surface of the substrate 22 of metal may be used as the metal body 12. When using Si for the substrate 22, to suppress reaction with the metal body 12 at a high temperature, an $SiO_2$ film is desirably formed at the Si substrate surface. The $SiO_2$ film is preferably a thermal oxide film of Si.

The selective emitter 10 is connected to the heat source through the gray body 24. As the gray body 24, an SiC layer may be provided at the surface 222 of the substrate 22. The SiC layer functions as a gray body close in absorbance to a black body, so by efficiently absorbing the incident heat, the selective emitter 10 itself easily becomes a high temperature and it becomes possible to increase the intensity of emitted light emitted from the metal body 12 side in the temperature region of 550° C. or more.

The substrate 22, by being formed by Si, metal, or quartz, efficiently conducts the heat from the gray body 24 to the metal body 12 and has heat resistance. If the substrate 22 is formed by a commercially available Si wafer polished to a mirror finish, it will have few relief shapes at the surface and will be excellent in flatness, so it is possible to provide the high flatness of the metal body 12 and composite layer 14 formed on the substrate 22 and the lower layer 16 and upper layer 26 and as a result possible to raise the reflectance and improve the wavelength selectivity. The substrate 22 formed by Si may be either polycrystalline or monocrystalline.

As the gray body 24, it is also possible to provide a Fe, Cr, or Ni oxide layer or a mixed oxide layer of the same. An oxide layer is high in absorbance and can efficiently conduct the heat incident on the surface of the oxide layer to the substrate 22 and as a result can increase the intensity of emitted light emitted from the metal body 12 side in the temperature region of 550° C. or more.

Two directions of incidence of emitted light incident on the selective emitter 10 may be considered: the case of incidence from the gray body 24 and substrate 22 side and the case of incidence from the upper layer 26 side. The selective emitter 10 emits wavelength-selected light from the upper layer 26 if emitted light emitted from industrial waste heat or other heat sources is incident from the gray body 24 and substrate 22 side.

On the other hand, in the selective emitter 10, by being struck by light from the upper layer 26 side, the wavelength of light is selected by the selective emitter 10 and the heat is efficiently absorbed. Excessive light is not emitted, so the emitter is difficult to cool. The absorbed heat is emitted through the substrate 22 and gray body 24 so application to solar heat power generation becomes possible.

Next, the method of production of the selective emitter of the present embodiment will be explained.

The metal body 12 may be preferably formed by the vacuum deposition method or the sputtering method. Whatever the method, the W, Mo, Fe, Ni, Cr, or other metal body 12 can be formed thin and uniform and a film with a good flatness can be formed.

The composite layer 14 can be preferably formed by the sputtering method. For example, it is possible to use a Cr chip placed on a $Cr_2O_3$ target, a Ti chip placed on a $TiO_2$ target, a Ta chip placed on a $Ta_2O_5$ target, and an Si chip placed on a $SiO_2$ target for sputtering to thereby form a layer of an oxide ($Cr_2O_3$, $TiO_2$, $Ta_2O_5$, or $SiO_2$) in which a metal (Cr, Ti, or Ta) or semiconductor (Si) is dispersed.

The lower layer 16 and upper layer 26 can be preferably formed by the vacuum deposition method, sputtering method, and chemical vapor deposition (CVD) method. Whatever the method, the layer of the dielectric, for example, $Ta_2O_5$, $TiO_2$, $Cr_2O_3$, and $SiO_2$, can be easily controlled in thickness to a thickness of several tens of nm and can keep uniformity. Further, the vacuum deposition method and sputtering method are also advantageous for treating wide area and are excellent in productivity.

After forming the composite layer 14, lower layer 16, and upper layer 26, it is possible to heat treat them in an Ar, $N_2$ gas, or other inert gas at 600° C. to 1200° C. to cause the metal or semiconductor atoms to aggregate in the base material 20 of the composite layer 14 and form particles of the added material 18 and densify the respective layers.

The SiC layer used as the gray body 24 can be suitably produced by CVD method, sputtering method, carbonation method, etc. In the case of the CVD method, carbon-containing gas and silicon-containing gas may be made to thermally decompose and react on the substrate 22 so as to form an SiC layer on the substrate 22.

If the substrate 22 is quartz or an Fe alloy or Ni alloy or other metal, the sputtering method may be used to deposit an SiC layer on the substrate 22. If the substrate 22 is Si, the carbonization method may be used to carbonize the surface of the substrate 22 in a hydrocarbon gas for an SiC layer forming.

If the substrate 22 is Si or quartz, it is possible to deposit an oxide layer used as the gray body 24 by the sputtering method. If the substrate 22 is an Fe alloy or Ni alloy, it is possible to easily form the oxide layer used as the gray body 24 on the surface of the substrate 22 by heating the substrate 22 in an oxidizing atmosphere. The adhesion of the oxide layer with the substrate 22 also becomes excellent.

Second Embodiment

Figure 4:
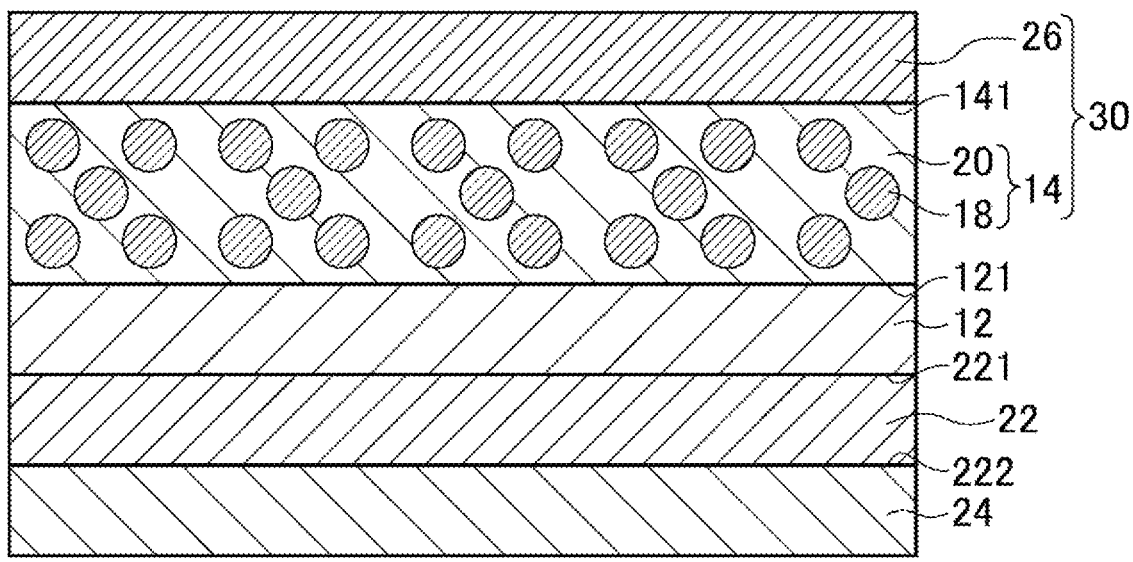
FIG. 4 is a longitudinal cross-sectional view schematically showing the configuration of the selective emitter according to a second embodiment.

A second embodiment will be explained with reference to FIG. 4. In FIG. 4, component members the same as the first embodiment are assigned the same notations. In the second embodiment, one surface 121 of the metal body 12 is provided with a composite layer 14 containing the added material 18 and the base material 20, while an upper layer 26 made of a dielectric is provided in contact with the surface 141 of the composite layer 14 to form a membrane laminate 30. That is, the embodiment differs from the first embodiment on the point that there is no lower layer comprised of a dielectric between the metal body 12 and the composite layer 14. In the present embodiment as well, a heat resistance and wavelength selectivity similar to the first embodiment are obtained.

In the second embodiment, there is no lower layer made of a dielectric between the metal body 12 and the composite layer 14, so care must be taken over diffusion and reaction between the metal body 12 and composite layer 14 at a high temperature. If the base material 20 of the composite layer 14 is made $SiO_2$, even at 1000° C., the metal body 12 and composite layer 14 will not form a compound ruining the wavelength selectivity, so this is preferable.

Further, by making the metal body 12 a Ti—W—Si layer or W—Si/Ti—W—Si layer, it is possible to suppress any reaction of the metal body 12 and composite layer 14 regardless of the main ingredients of the composite layer 14, so this is preferable.

Third Embodiment

Figure 5:
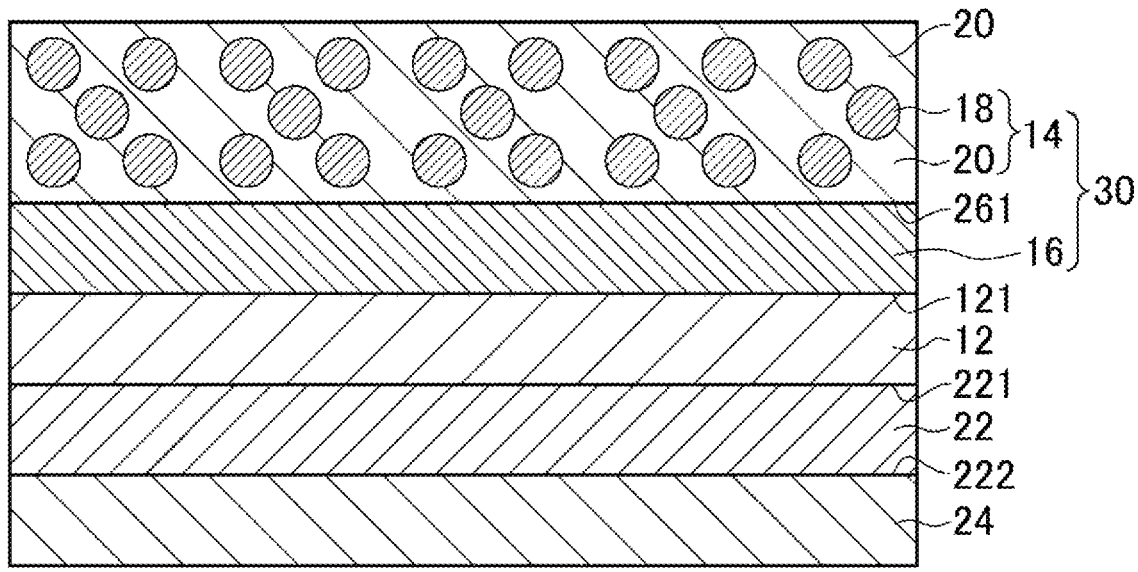
FIG. 5 is a longitudinal cross-sectional view schematically showing the configuration of the selective emitter according to a third embodiment.
Figure 6:
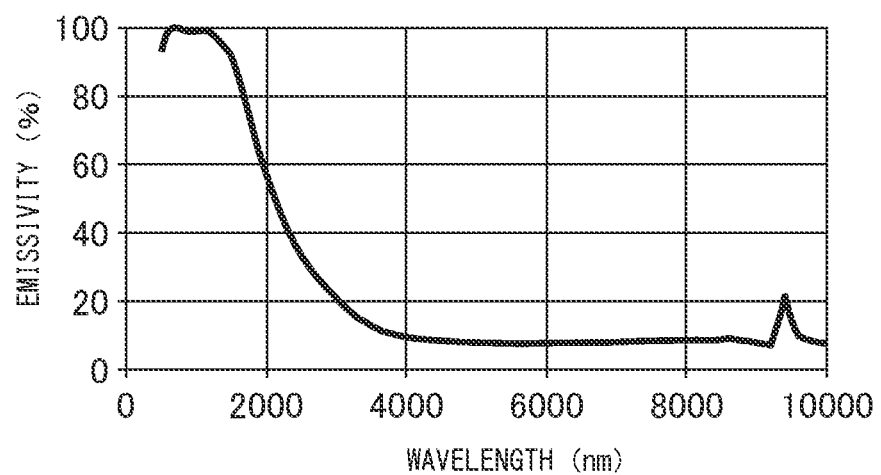
FIG. 6 is a view showing the spectral emissivity of light emitted from the selective emitter of Example 5.
Figure 7:
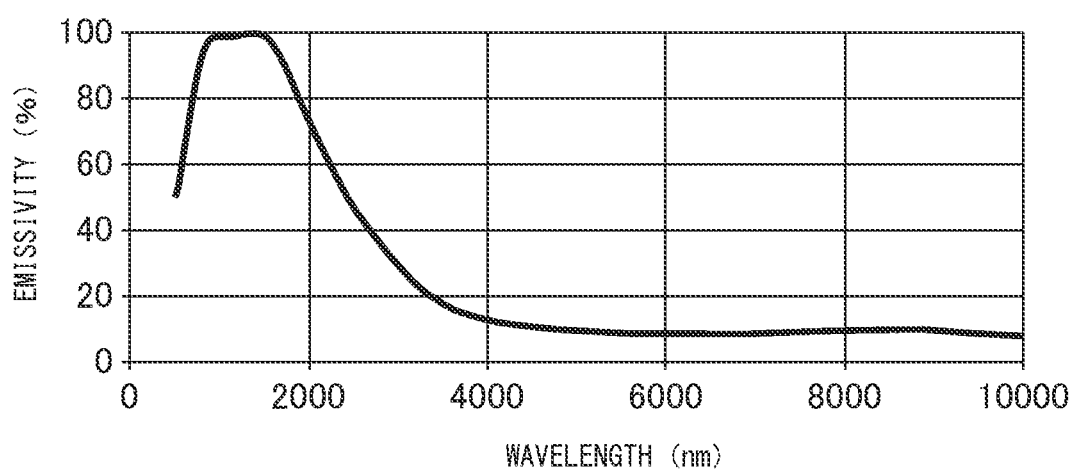
FIG. 7 is a view showing the spectral emissivity of light emitted from the selective emitter of Example 12.
Figure 8:
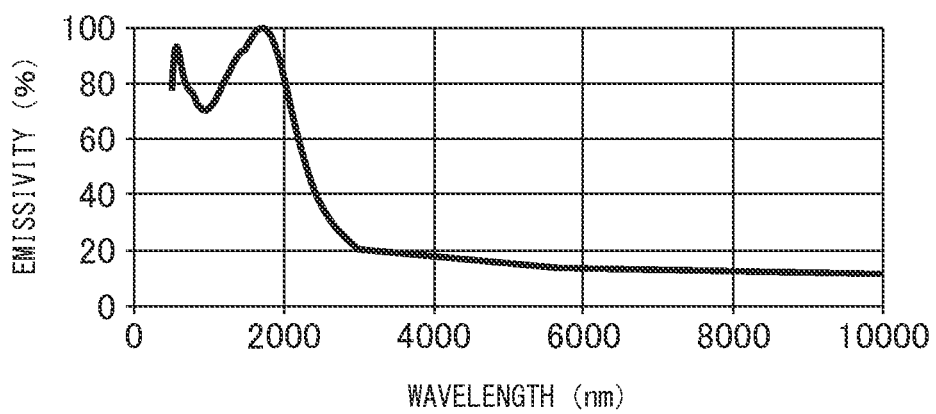
FIG. 8 is a view showing the spectral emissivity of light emitted from the selective emitter of Example 19.
Figure 9:
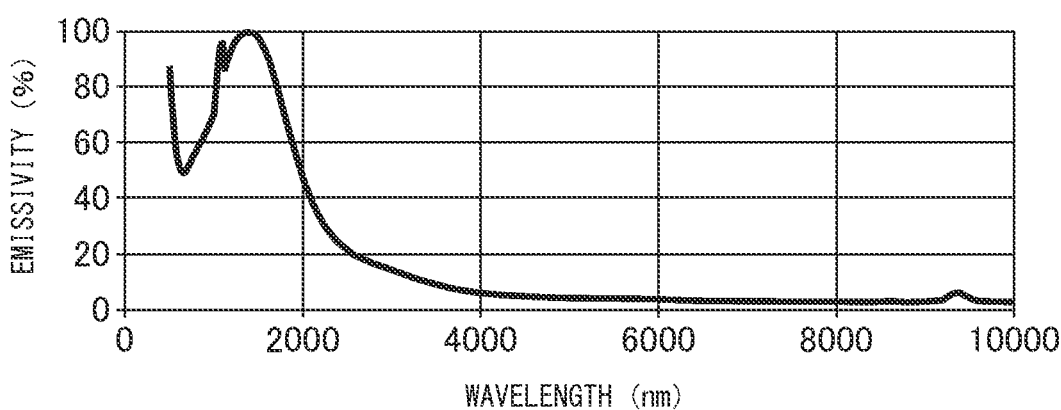
FIG. 9 is a view showing the spectral emissivity of light emitted from the selective emitter of Example 23.
Figure 10:
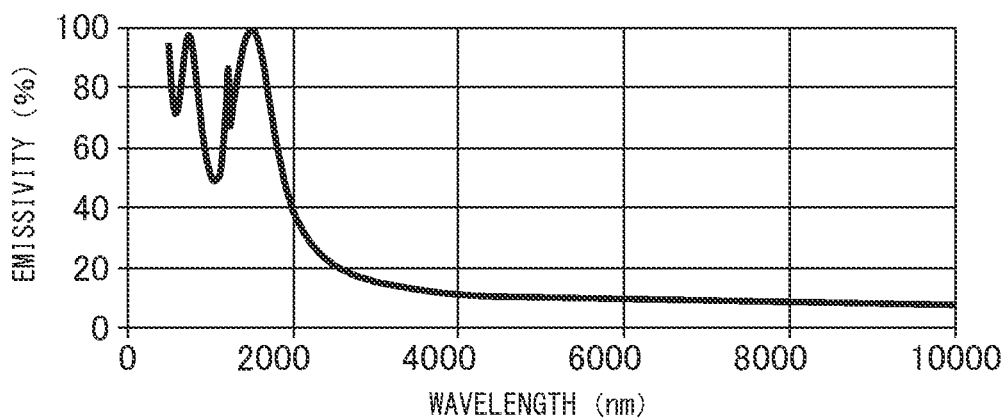
FIG. 10 is a view showing the spectral emissivity of light emitted from the selective emitter of Example 25.
Figure 11:
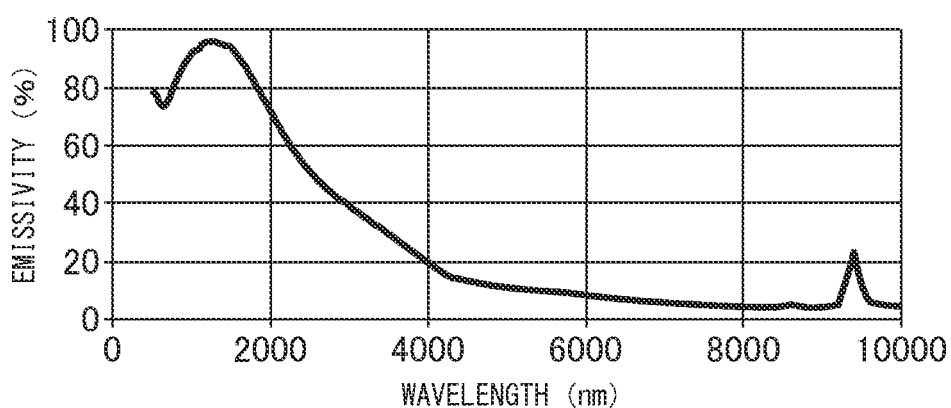
FIG. 11 is a view showing the spectral emissivity of light emitted from the selective emitter of Example 26.
Figure 12:
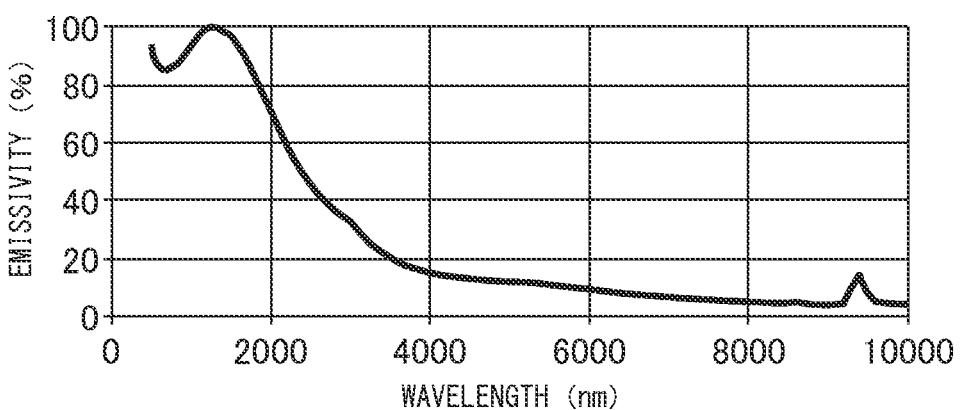
FIG. 12 is a view showing the spectral emissivity of light emitted from the selective emitter of Example 29.
Figure 13:
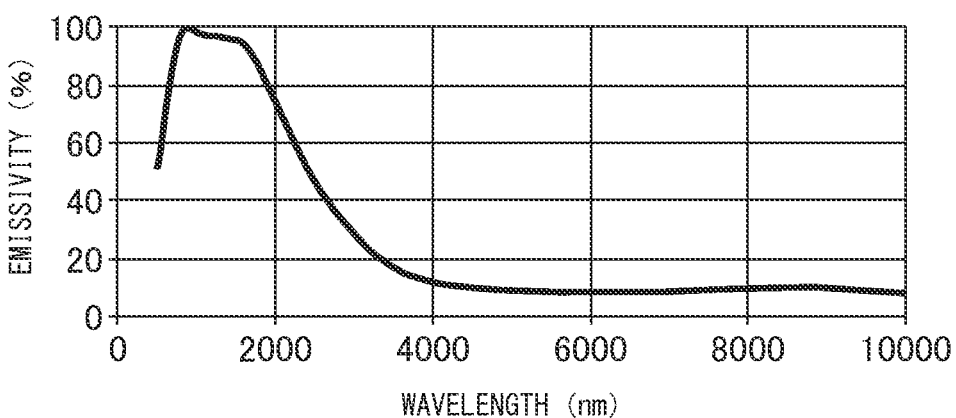
FIG. 13 is a view showing the spectral emissivity of light emitted from the selective emitter of Example 33.
Figure 14:
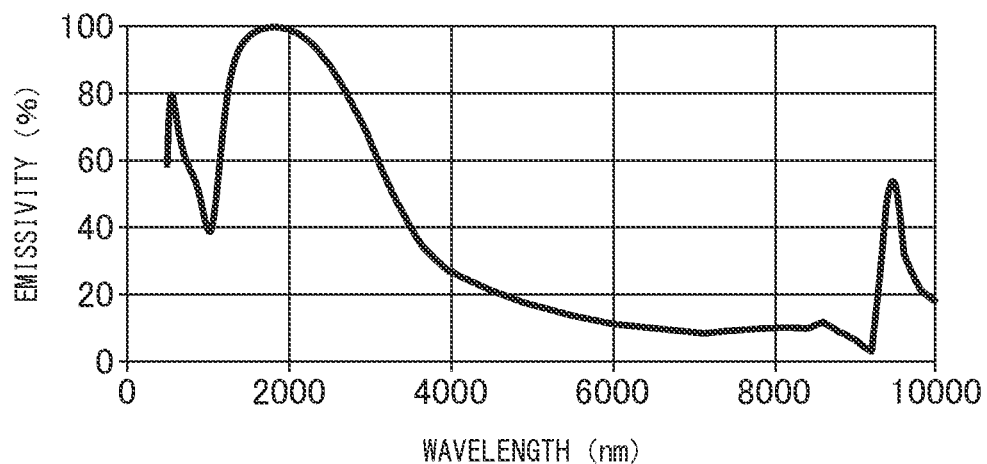
FIG. 14 is a view showing the spectral emissivity of light emitted from the selective emitter of Example 44.
Figure 15:
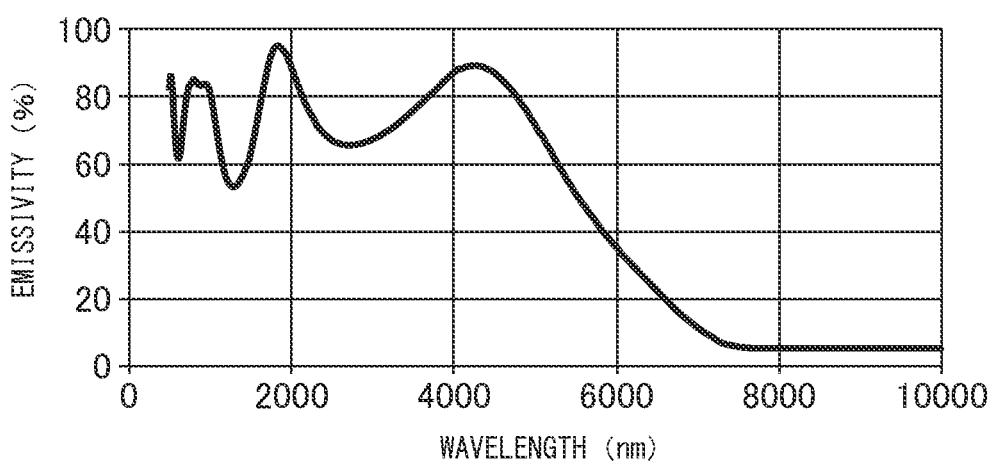
FIG. 15 is a view showing the spectral emissivity of light emitted from the selective emitter of Example 48.
Figure 16:
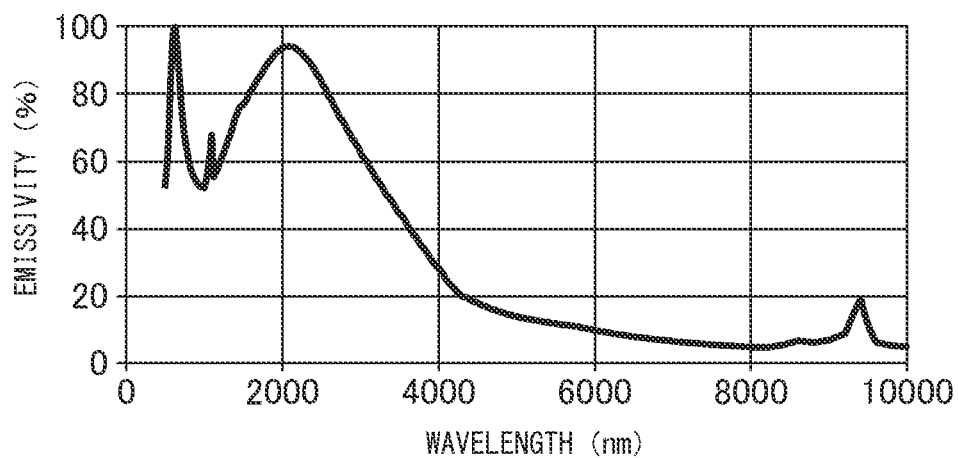
FIG. 16 is a view showing the spectral emissivity of light emitted from the selective emitter of Example 49.
Figure 17:
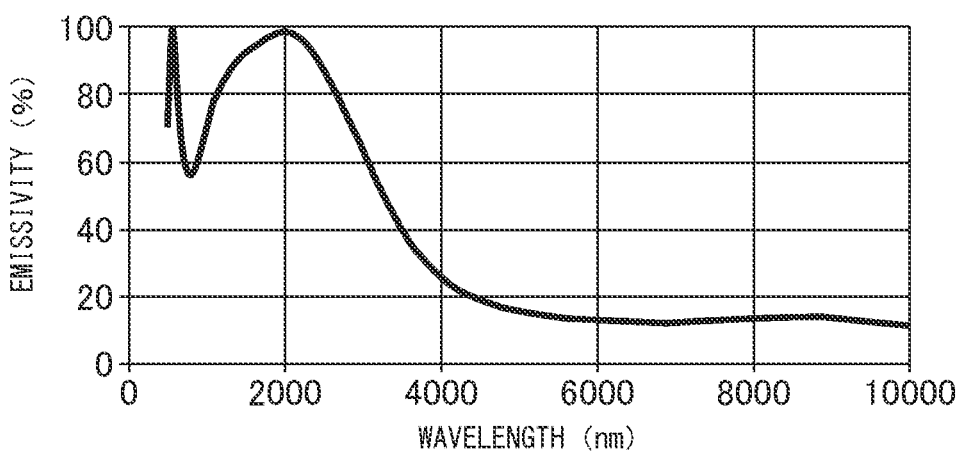
FIG. 17 is a view showing the spectral emissivity of light emitted from the selective emitter of Example 52.

A third embodiment will be explained with reference to FIG. 5. In FIG. 5, component members the same as the first embodiment are assigned the same notations. In the third embodiment, one surface 121 of the metal body 12 is formed with a lower layer 15 made of a dielectric. In contact with the surface 161 of the lower layer 16, a composite layer 14 containing the added material 18 and the base material 20 is provided to form the membrane laminate 30. That is, this differs from the first embodiment in the point that there is no upper layer made of a dielectric at the surface of the composite layer 14 at the opposite side to the lower layer 16. In the present embodiment as well, a heat resistance and wavelength selectivity similar to the first embodiment are obtained.

In the third embodiment, there is no upper layer made of a dielectric on one surface of the composite layer 14. It is necessary to pay attention to the point of directly contacting the atmosphere. If making the added material 18 of the composite layer 14 Si and making the base material 20 $SiO_2$, the heat resistance is high even in an oxidizing atmosphere, so this is preferred.

EXAMPLES

Samples

In accordance with the above description of the method of production, selective emitter were fabricated and evaluated for heat resistance. Each of the selective emitter 10 was comprised of a substrate 22 on which a metal body 12, lower layer 16, composite layer 14, and upper layer 26 were continuously formed by sputtering while changing the target. Some of the selective emitter were configured provided with only one of the lower layer 16 and upper layer 26.

As the substrate 22, a Si wafer with a thermal oxide film ($SiO_2$ thickness of 0.3 μm) was used. A film was formed at ordinary temperature (state not heating substrate). The film was formed using a 6 inch diameter target in an Ar gas atmosphere (flow rate of 25 sccm and pressure of 0.7 Pa).

The gray body was formed under conditions of use of an SiC target by an AC power supply at 800 W (SiC thickness of 0.3 μm).

The metal body 12 was formed under conditions of use of a target of W, Mo, Cr, Fe, Ni, or TiW (Ti: 10 mass %, W: 90 mass %) by a DC power supply at 500 W.

The lower layer 16 and upper layer 26 were formed under conditions of a use of a target of $Cr_2O_3$, $TiO_2$, $SiO_2$, or $Ta_2O_5$ by an AC power supply at 800 W.

The composite layer 14 may be formed under the same conditions as the lower layer 16 and upper layer 26 using a Cr chip placed on a $Cr_2O_3$ target, a Ti chip placed on a $TiO_2$ target, an Si chip placed on an $SiO_2$ target, or a Ta chip placed on a $Ta_2O_5$ target. After formation, the film was heat treated in an $N_2$ gas atmosphere at 1000° C. for 1 hour. The volume percentage of the added material contained in the composite layer 14 was controlled by changing the size and number of chips placed on the target. The actual volume percentage was confirmed by XPS (X-ray photoelectron spectroscopy).

Further, the thickness of each layer was measured by measuring the thickness of a film formed in advance by a stylus profilometer. The film deposition rate was found and the sputtering time was controlled so as to obtain a predetermined thickness.

An experiment was also performed using SUS304 and a Ni-based alloy (Inconel®, Ni: 76 mass %, Cr: 15.5 mass %, Fe: 8.0 mass %) as a substrate 22. In this case, the mirror polished surface of the substrate 22 was made the metal body 12. Sputtering was not separately used to form the metal body 12.

An experiment was also conducted using a Si wafer as the substrate 22. As the metal body 12, a Ti—W layer or W/Ti—W multilayer was formed, then the lower layer 16, composite layer 14, and upper layer 26 were formed. If heating this in an $N_2$ gas atmosphere at 1000° C. for 1 hour after formation, the Ti—W layer or W/Ti—W layer reacted with the Si to be silicided resulting in a Ti—W—Si layer or W—Si/Ti—W—Si layer. As the target, Ti—W—Si (for example, Ti: 7 wt %, W: 65 wt %, Si: 28 wt %) or W—Si (for example, W: 77 wt %, Si: 23 wt %) may be used to directly form a film by sputtering on a Si wafer or other substrate.

The samples were prepared matching the photovoltaic devices to which the selective emitter 10 was applied. That is, Examples 1 to 39 were prepared matching with GaSb, while Examples 40 to 57 were prepared matching with InGaAs. The configurations of the samples are shown in Table 1 to Table 3.

Method of Evaluation

The emissivity at ordinary temperature was made the value obtained by measuring the regular reflectance R (%) in a near infrared-infrared spectrometer by normal incidence (incident angle of) 10° and calculating 100(%)–R (%).

The emissivity at high temperature was measured by running light emitted from a black body furnace heated to 1000° C. and light emitted from a sample heated in a sample heating furnace through a light guide for spectrometry by a spectroscope. First, the light emitted from the black body furnace heated to 1000° C. was used to correct the spectroscope. Next, the light emitted from the sample heated to the same temperature was measured to find the emissivity at high temperature. Note that the true temperature of the heated sample was determined by heating a substrate coated on its surface by a black body spray (made by Japan Sensor, JSC-3, emissivity 0.94) in the sample heating furnace and measuring the emitted light of the substrate. Further, the true temperature was within 1000±10° C. in range in each experiment.

Each sample was evaluated corresponding to the characteristics required when the photovoltaic device is GaSb and the characteristics required when the photovoltaic device is InGaAs.

If the photovoltaic device is GaSb, the selective emitter preferably has a high emissivity at 0.8 μm to 1.8 μm in range where a absorption coefficient is high and a low emissivity at a longer wavelength side. The case where the average emissivity in the 0.8 μm to 1.8 μm wavelength range where a high emissivity is preferred is 90% or more was evaluated as "A", the case where it was less than 90% to 80% was evaluated as "B", and the case where it was less than 80% to 70% was evaluated as "C" due to the possibility of use with improvement. Further, the case where the average emissivity in the 3.5 μm to 10 μm wavelength range where a low emissivity is preferred is 10% or less was evaluated as "A", the case where it is over 10% to 20% was evaluated as "B", and the case where it is over 20% to 30% was evaluated as "C" due to the possibility of use with improvement. The results are shown in Table 1 and Table 2. The spectral emissivities of the light emitted from the selective emitter of Examples 5, 12, 19, 23, 25, 26, 29, and 33 are shown in FIG. 6 to FIG. 13.

If the photovoltaic device is InGaAs, the selective emitter preferably has a high emissivity at 1.5 μm to 2.5 in range where an absorption coefficient is high and a low emissivity at a longer wavelength side. The case where the average emissivity in the 1.5 μm to 2.5 μm wavelength range where a high emissivity is preferred is 90% or more was evaluated as "A", the case where it was less than 90% to 80% was evaluated as "B", and the case where it was less than 80% to 70% was evaluated as "C" due to the possibility of use with improvement. Further, the case where the average emissivity in the 4 μm to 10 μm wavelength range where a low emissivity is preferred is 10% or less was evaluated as "A", the case where it is over 10% to 20% was evaluated as "B", and the case where it is over 20% to 30% was evaluated as "C" due to the possibility of use with improvement. The results are shown in Table 3. The spectral emissivities of the light emitted from the selective emitter of Examples 44, 48, 49, and 52 are respectively shown in FIGS. 14 to 17.

From Table 1 to Table 3, the selective emitter according to Examples 1 to 57 have excellent wavelength selectivities at ordinary temperature. It was confirmed that even at a high temperature, deterioration of the wavelength selectivity was suppressed and there was heat resistance up to 1000° C. Note that, when using quartz as the substrate, the configuration was substantially the same as a Si wafer with a thermal oxide film.

TABLE 1

| | | Metal body | | Lower layer Dielectric | | Composite layer Metal or semiconductor | |
|---|---|---|---|---|---|---|---|
| Example | Substrate | Material | Thickness (nm) | Material | Thickness (nm) | Material | Content (%) |
| 1 | Si with thermal oxide film | W | 200 | $Cr_2O_3$ | 70 | Cr | 80 |
| 2 | Si with thermal oxide film | W | 200 | $Cr_2O_3$ | 10 | Cr | 80 |
| 3 | Si with thermal oxide film | W | 200 | $Cr_2O_3$ | 80 | Cr | 30 |
| 4 | Si with thermal oxide film | W | 200 | $Cr_2O_3$ | 140 | Cr | 50 |
| 5 | Si with thermal oxide film | W | 200 | $SiO_2$ | 100 | Cr | 80 |
| 6 | Si with thermal oxide film | W | 200 | $SiO_2$ | 70 | Cr | 80 |
| 7 | Si with thermal oxide film | W | 200 | $Cr_2O_3$ | 90 | Cr | 80 |
| 8 | Si with thermal oxide film | Cr | 200 | $Cr_2O_3$ | 130 | Cr | 80 |
| 9 | Si with thermal oxide film | Fe | 200 | $Cr_2O_3$ | 60 | Cr | 80 |
| 10 | Si with thermal oxide film | Mo | 200 | $Cr_2O_3$ | 40 | Cr | 80 |
| 11 | Si with thermal oxide film | Ni | 200 | $SiO_2$ | 60 | Cr | 80 |
| 12 | | Inconel ® | | $Cr_2O_3$ | 60 | Cr | 80 |
| 13 | Si with thermal oxide film | W | 200 | $TiO_2$ | 50 | Ti | 80 |
| 14 | Si with thermal oxide film | W | 200 | $SiO_2$ | 110 | Ti | 80 |
| 15 | Si with thermal oxide film | W | 200 | $TiO_2$ | 40 | Ti | 50 |
| 16 | Si with thermal oxide film | W | 200 | $TiO_2$ | 80 | Ti | 80 |
| 17 | Si with thermal oxide film | W | 200 | $TiO_2$ | 90 | Ti | 50 |
| 18 | Si with thermal oxide film | W | 200 | — | — | Ti | 80 |
| 19 | Si with thermal oxide film | W | 200 | $TiO_2$ | 40 | Ti | 30 |
| 20 | Si with thermal oxide film | W | 200 | — | — | Ti | 30 |
| 21 | Si with thermal oxide film | W | 200 | $SiO_2$ | 60 | Si | 80 |
| 22 | Si with thermal oxide film | W | 200 | — | — | Si | 80 |
| 23 | Si with thermal oxide film | TiW | 200 | — | — | Si | 80 |
| 24 | Si with thermal oxide film | Cr | 200 | — | — | Si | 80 |
| 25 | Si with thermal oxide film | W | 200 | $Ta_2O_5$ | 50 | Ta | 80 |

| | Composite layer Dielectric | | Upper layer Dielectric | | Wavelength selectivity | | | |
|---|---|---|---|---|---|---|---|---|
| | | | | | Ordinary temperature | | High temperature | |
| Example | Material | Thickness (nm) | Material | Thickness (nm) | 0.8-1.8 | 3.5-10 | 0.8-1.8 | 3.5-10 |
| 1 | $Cr_2O_3$ | 20 | $Cr_2O_3$ | 120 | A | A | A | B |
| 2 | $Cr_2O_3$ | 80 | $Cr_2O_3$ | 150 | B | B | B | B |
| 3 | $Cr_2O_3$ | 20 | $Cr_2O_3$ | 50 | B | A | B | B |
| 4 | $Cr_2O_3$ | 10 | — | — | C | A | C | C |
| 5 | $Cr_2O_3$ | 10 | $SiO_2$ | 90 | A | A | A | A |
| 6 | $Cr_2O_3$ | 20 | $Cr_2O_3$ | 120 | A | A | A | A |
| 7 | $Cr_2O_3$ | 10 | $SiO_2$ | 90 | B | A | B | B |
| 8 | $Cr_2O_3$ | 30 | $Cr_2O_3$ | 50 | A | B | B | B |
| 9 | $Cr_2O_3$ | 10 | $Cr_2O_3$ | 60 | A | B | C | C |
| 10 | $Cr_2O_3$ | 20 | $Cr_2O_3$ | 90 | A | B | C | C |
| 11 | $Cr_2O_3$ | 30 | $Cr_2O_3$ | 60 | A | B | C | C |
| 12 | $Cr_2O_3$ | 20 | $Cr_2O_3$ | 100 | A | A | A | A |
| 13 | $TiO_2$ | 20 | $TiO_2$ | 70 | B | A | C | B |
| 14 | $TiO_2$ | 20 | $SiO_2$ | 70 | A | A | A | A |
| 15 | $TiO_2$ | 30 | $TiO_2$ | 50 | B | A | B | B |
| 16 | $TiO_2$ | 60 | — | — | A | A | C | C |
| 17 | $TiO_2$ | 20 | — | — | A | A | C | C |
| 18 | $TiO_2$ | 90 | $TiO_2$ | 60 | B | A | C | C |
| 19 | $TiO_2$ | 30 | $TiO_2$ | 40 | B | A | B | B |
| 20 | $TiO_2$ | 70 | $TiO_2$ | 50 | A | A | C | C |
| 21 | $SiO_2$ | 60 | $SiO_2$ | 10 | C | A | C | A |
| 22 | $SiO_2$ | 100 | $SiO_2$ | 60 | C | A | C | A |
| 23 | $SiO_2$ | 70 | $SiO_2$ | 50 | B | A | B | A |
| 24 | $SiO_2$ | 80 | $SiO_2$ | 90 | C | A | C | A |
| 25 | $Ta_2O_5$ | 10 | $Ta_2O_5$ | 210 | C | A | C | B |

TABLE 2

| | | Lower layer | | | | Composite layer | | | | Upper layer | | Wavelength selectivity | | | |
| | | Metal body | | Dielectric | | Metal or semiconductor | | Dielectric | | Dielectric | | Ordinary temperature | | High temperature | |
| Example | Substrate | Material | Thickness (nm) | Material | Thickness (nm) | Material | Content (%) | Material | Thickness (nm) | Material | Thickness (nm) | 0.8-1.8 | 3.5-10 | 0.8-1.8 | 3.5-10 |
|---|---|---|---|---|---|---|---|---|---|---|---|---|---|---|---|
| 26 | Si | WSi/TiWSi | 400 | SiO$_2$ | 40 | Si | 50 | SiO$_2$ | 30 | SiO$_2$ | 100 | A | A | A | A |
| 27 | Si | TiWSi | 200 | SiO$_2$ | 30 | Si | 80 | SiO$_2$ | 50 | SiO$_2$ | 20 | B | A | B | B |
| 28 | Si | WSi/TiWSi | 400 | SiO$_2$ | 50 | Cr | 30 | Cr$_2$O$_3$ | 20 | SiO$_2$ | 100 | A | B | A | B |
| 29 | Si | TiWSi | 200 | SiO$_2$ | 60 | Cr | 30 | Cr$_2$O$_3$ | 30 | SiO$_2$ | 70 | A | A | A | A |
| 30 | Si | TiWSi | 200 | SiO$_2$ | 80 | Ti | 80 | TiO$_2$ | 20 | SiO$_2$ | 130 | A | A | B | B |
| 31 | Si | WSi/TiWSi | 400 | SiO$_2$ | 70 | Ti | 80 | TiO$_2$ | 20 | SiO$_2$ | 130 | A | B | B | B |
| 32 | Si | WSi/TiWSi | 400 | Cr$_2$O$_3$ | 20 | Cr | 80 | Cr$_2$O$_3$ | 30 | Cr$_2$O$_3$ | 110 | A | A | A | B |
| 33 | Si | TiWSi | 200 | Cr$_2$O$_3$ | 60 | Cr | 80 | Cr$_2$O$_3$ | 20 | Cr$_2$O$_3$ | 90 | A | A | A | A |
| 34 | Si | TiWSi | 200 | TiO$_2$ | 30 | Ti | 50 | TiO$_2$ | 20 | TiO$_2$ | 50 | A | A | B | B |
| 35 | Si | WSi/TiWSi | 400 | — | | Si | 50 | SiO$_2$ | 60 | SiO$_2$ | 120 | A | A | A | B |
| 36 | Si | TiWSi | 200 | SiO$_2$ | 30 | Si | 80 | SiO$_2$ | 50 | — | | B | A | B | B |
| 37 | Si | WSi/TiWSi | 400 | — | | Cr | 30 | Cr$_2$O$_3$ | 40 | SiO$_2$ | 150 | A | B | A | B |
| 38 | Si | WSi/TiWSi | 400 | — | | Cr | 30 | Cr$_2$O$_3$ | 40 | Cr$_2$O$_3$ | 80 | A | B | B | B |
| 39 | Si | TiWSi | 200 | TiO$_2$ | 80 | Ti | 80 | TiO$_2$ | 20 | — | | C | A | C | C |

TABLE 3

| | | Metal body | | Lower layer Dielectric | | Composite layer Metal or semiconductor | |
| Example | Substrate | Material | Thickness (nm) | Material | Thickness (nm) | Material | Content (%) |
|---|---|---|---|---|---|---|---|
| 40 | Si with thermal oxide film | W | 200 | Cr$_2$O$_3$ | 260 | Cr | 80 |
| 41 | Si with thermal oxide film | W | 200 | Cr$_2$O$_3$ | 30 | Cr | 30 |
| 42 | Si with thermal oxide film | W | 200 | Cr$_2$O$_3$ | 70 | Cr | 30 |
| 43 | Si with thermal oxide film | W | 200 | SiO$_2$ | 70 | Cr | 80 |
| 44 | Si with thermal oxide film | W | 200 | SiO$_2$ | 300 | Cr | 80 |
| 45 | Si with thermal oxide film | Cr | 200 | Cr$_2$O$_3$ | 40 | Cr | 30 |
| 46 | Si with thermal oxide film | SUS304 | substrate | Cr$_2$O$_3$ | 30 | Cr | 30 |
| 47 | Si with thermal oxide film | W | 200 | TiO$_2$ | 50 | Ti | 80 |
| 48 | Si with thermal oxide film | W | 200 | TiO$_2$ | 20 | Ti | 30 |
| 49 | Si | WSi/TiWSi | 400 | SiO$_2$ | 20 | Si | 50 |
| 50 | Si | WSi/TiWSi | 400 | SiO$_2$ | 120 | Cr | 50 |
| 51 | Si | TiWSi | 200 | SiO$_2$ | 150 | Ti | 80 |
| 52 | Si | WSi/TiWSi | 400 | Cr$_2$O$_3$ | 70 | Cr | 80 |
| 53 | Si | TiWSi | 200 | TiO$_2$ | 40 | Ti | 80 |
| 54 | Si | WSi/TiWSi | 400 | — | | Si | 50 |
| 55 | Si | WSi/TiWSi | 400 | — | | Cr | 30 |
| 56 | Si | WSi/TiWSi | 400 | — | | Cr | 30 |
| 57 | Si | TiWSi | 200 | TiO$_2$ | 120 | Ti | 80 |

| | Composite layer Dielectric | | Upper layer Dielectric | | Wavelength selectivity | | | |
| | | | | | Ordinary temperature | | High temperature | |
| Example | Material | Thickness (nm) | Material | Thickness (nm) | 1.5-2.5 | 4-10 | 1.5-2.5 | 4-10 |
|---|---|---|---|---|---|---|---|---|
| 40 | Cr$_2$O$_3$ | 30 | Cr$_2$O$_3$ | 210 | A | B | B | B |
| 41 | Cr$_2$O$_3$ | 100 | Cr$_2$O$_3$ | 120 | A | C | B | C |
| 42 | Cr$_2$O$_3$ | 100 | — | — | B | B | C | C |
| 43 | Cr$_2$O$_3$ | 30 | Cr$_2$O$_3$ | 100 | A | B | B | B |
| 44 | Cr$_2$O$_3$ | 20 | SiO$_2$ | 250 | A | B | A | B |
| 45 | Cr$_2$O$_3$ | 70 | Cr$_2$O$_3$ | 120 | A | B | B | B |
| 46 | Cr$_2$O$_3$ | 60 | Cr$_2$O$_3$ | 120 | A | B | B | B |
| 47 | TiO$_2$ | 30 | TiO$_2$ | 90 | B | A | B | C |

TABLE 3-continued

| | | | | | | | | |
|---|---|---|---|---|---|---|---|---|
| 48 | TiO$_2$ | 140 | TiO$_2$ | 20 | B | A | C | C |
| 49 | SiO$_2$ | 140 | SiO$_2$ | 30 | B | A | B | A |
| 50 | Cr$_2$O$_3$ | 40 | SiO$_2$ | 150 | B | B | B | B |
| 51 | TiO$_2$ | 20 | SiO$_2$ | 190 | A | B | B | B |
| 52 | Cr$_2$O$_3$ | 20 | Cr$_2$O$_3$ | 170 | A | B | A | B |
| 53 | TiO$_2$ | 50 | TiO$_2$ | 100 | A | A | B | B |
| 54 | SiO$_2$ | 20 | SiO$_2$ | 150 | A | A | A | B |
| 55 | Cr$_2$O$_3$ | 60 | SiO$_2$ | 220 | B | B | B | C |
| 56 | Cr$_2$O$_3$ | 30 | Cr$_2$O$_3$ | 160 | A | B | B | C |
| 57 | TiO$_2$ | 30 | — | | B | B | C | C |

REFERENCE SIGNS LIST 10. selective emitter
12. metal body
14. composite layer
16. lower layer
18. added material
20. base material
26. upper layer
30. membrane laminate

The invention claimed is:

1. A selective emitter comprising
a metal body,
a lower layer made of a dielectric provided on one surface of the metal body,
a composite layer provided on another surface of the lower layer at an opposite side to the metal body side, and
an upper layer made of a dielectric provided on another surface of the composite layer at an opposite side to the lower layer, and
the composite layer being a layer provided with a metal or semiconductor dispersed in an oxide of the metal or the semiconductor,
wherein the metal body is formed by titanium-tungsten-silicide (Ti—W—Si) and tungsten silicide (W—Si) stacked together.

2. The selective emitter according to claim 1 wherein
the metal or semiconductor dispersed in the composite layer is one selected from Cr, Si, Ta, and Ti, and the lower layer and the upper layer are an oxide of the metal or the semiconductor.

3. The selective emitter according to claim 1 wherein
the metal or semiconductor dispersed in the composite layer is one selected from Cr, Si, Ta, and Ti,
the lower layer is an oxide of the metal or the semiconductor, or SiO$_2$, and
the upper layer is SiO$_2$.

4. The selective emitter according to claim 1 wherein a physical thickness of the composite layer is 5 nm to 200 nm and physical thicknesses of the lower layer and the upper layer are 10 nm to 300 nm.

5. The selective emitter according to claim 1 comprising
a substrate provided on another surface of the metal body at an opposite side to the one surface and
a gray body provided on a surface of the substrate at an opposite side to the metal body side.

6. The selective emitter according to claim 5 wherein the substrate is Si or quartz.

7. The selective emitter according to claim 5 wherein the substrate is comprised of Si and an SiO$_2$ film is provided between the substrate and the metal body.

8. The selective emitter according to claim 5 wherein the substrate is a metal substrate.

9. The selective emitter according to claim 8 wherein the metal substrate is formed by an Fe alloy or Ni alloy.

10. The selective emitter according to claim 5 wherein the gray body comprises at least one of SiC, Fe oxide, Cr oxide, Ni oxide, or a mixture of an Fe oxide, Cr oxide, and Ni oxide.

* * * * *